United States Patent
Adachi et al.

(10) Patent No.: US 8,552,513 B2
(45) Date of Patent: Oct. 8, 2013

(54) SEMICONDUCTOR PRESSURE SENSOR

(75) Inventors: Takuya Adachi, Niigata-ken (JP);
Katsuya Kikuiri, Niigata-ken (JP);
Tetsuya Fukuda, Niigata-ken (JP);
Hisanobu Okawa, Niigata-ken (JP);
Takayuki Minagawa, Niigata-ken (JP)

(73) Assignee: ALPS Electric Co., Ltd., Tokyo (JP)

( * ) Notice: Subject to any disclaimer, the term of this patent is extended or adjusted under 35 U.S.C. 154(b) by 640 days.

(21) Appl. No.: 12/722,079

(22) Filed: Mar. 11, 2010

(65) Prior Publication Data
US 2010/0164028 A1 Jul. 1, 2010

Related U.S. Application Data

(63) Continuation of application No. PCT/JP2008/067239, filed on Sep. 25, 2008.

(30) Foreign Application Priority Data

Sep. 25, 2007 (JP) ................................ 2007-247085
Jan. 17, 2008 (JP) ................................ 2008-007682

(51) Int. Cl.
*H01L 29/84* (2006.01)

(52) U.S. Cl.
USPC ........... 257/419; 257/252; 257/254; 257/415; 257/E29.324; 438/53; 73/715

(58) Field of Classification Search
USPC .......... 257/419, 415, E21.703, E27.112, 252, 257/254, E29.324; 438/53; 73/715
See application file for complete search history.

(56) References Cited

U.S. PATENT DOCUMENTS

| | | | |
|---|---|---|---|
| 6,619,133 B1 * | 9/2003 | Goshoo et al. | 73/754 |
| 7,786,541 B2 * | 8/2010 | Izuo et al. | 257/419 |
| 2001/0052628 A1 * | 12/2001 | Ishio et al. | 257/419 |
| 2009/0140355 A1 | 6/2009 | Izuo et al. | |

FOREIGN PATENT DOCUMENTS

| | | |
|---|---|---|
| JP | 2-281760 | 11/1990 |
| JP | 5-63211 | 3/1993 |
| JP | 6-224450 | 8/1994 |
| JP | 2001-352078 | 12/2001 |
| JP | 2001-358345 | 12/2001 |
| JP | 2002-71493 | 3/2002 |
| JP | 2002-208708 | 7/2002 |
| JP | 2002-350259 | 12/2002 |
| JP | 2008-180912 | 8/2008 |
| WO | 2007/058010 A1 | 5/2007 |
| WO | WO 2007058010 A1 * | 5/2007 |

* cited by examiner

*Primary Examiner* — Tom Thomas
*Assistant Examiner* — Ermias Woldegeorgis
(74) *Attorney, Agent, or Firm* — Brinks Hofer Gilson & Lione

(57) ABSTRACT

A semiconductor pressure sensor includes a cavity disposed in one silicon substrate of a SOI substrate having two silicon substrates bonded to each other with an oxide film therebetween and a diaphragm formed from the other silicon substrate and the oxide film, wherein the oxide film, bordering the cavity, of the diaphragm includes an arc-shaped section at the boundary portion to the one silicon substrate defining the inner wall side surface of the cavity, the arc-shaped section having the same width as the width of the cavity at a desired section in the one silicon substrate and reducing the width of the cavity from the boundary portion toward the diaphragm center.

7 Claims, 6 Drawing Sheets

SEMICONDUCTOR PRESSURE SENSOR

RELATED APPLICATIONS

This application is a Continuation of International Application No. PCT/JP2008/067239 filed on Sep. 25, 2008, which claims benefit of the Japanese Patent Application No. 2007-247085 filed on Sep. 25, 2007 and Japanese Patent Application No. 2008-007682 filed on Jan. 17, 2008, all of which are hereby incorporated by reference.

BACKGROUND OF THE INVENTION

1. Field of the Invention

The present invention relates to semiconductor pressure sensor to measure pressures, e.g., air pressure.

2. Description of the Related Art

Previously, diaphragm type semiconductor pressure sensors have been known as semiconductor pressure sensors to measure automobile tire pressures and the like (refer to Japanese Unexamined Patent Application Publication Nos. 2001-358345, 2001-352078, 2002-208708, 5-063211, 2002-071493, and 2002-350259).

FIG. 6 shows a cross-sectional structure of a semiconductor pressure sensor in a related art. This semiconductor pressure sensor includes a semiconductor substrate 110 formed from a silicon on insulator (SOI) substrate and configured in such a way that a first silicon substrate 111 and a second silicon substrate 113 are laminated with an oxide film 112 therebetween and piezo-resistance elements 103 and circuit elements 104 constitute a bridge circuit on the first silicon substrate 111. Regarding this semiconductor substrate 110, a laminated film composed of a photoresist and the like is formed on the surface (lower surface in the drawing) of the second silicon substrate 113, and the second silicon substrate 113 is dry-etched while the resulting laminated film is used as a mask, so as to form a concave portion (cavity) 122. Thereafter, the laminated film is removed through wet etching, and the semiconductor substrate 110 is bonded to a silicon substrate or a glass substrate in such a way that the concave portion 122 comes into a vacuum state.

In this regard, a diaphragm 121 is formed into the shape of a rectangle in a plan view in such a way that a piezo-resistance element 103 lies on a center of each side of the diaphragm 121. The midpoint voltage of the bridge circuit is output as a voltage based on the pressure measurement.

However, in a silicon oxide film removal step of the semiconductor pressure sensor in the related art, a silicon oxide film serving as a lower layer portion of the laminated film is removed through wet etching by using a hydrofluoric acid based etching solution or the like. At that time, the boundary portion of the oxide film 112 to the second silicon substrate 113 is over etched, so that an eroded portion 112a is formed. The size and the position of the diaphragm 121 is changed because of this eroded portion 112a. It is difficult to control the amount, the depth, and the like of the eroded portion 112a due to over etching and, therefore, it is difficult to control the size and the position of the diaphragm 121. Consequently, positional deviation occurs between the outline of the diaphragm 121 and the piezo-resistance elements 103 relatively and, in addition, an error in the shape of the diaphragm 121 occurs, so that the interrelation between the pressure and the midpoint voltage is changed and a measurement error occurs.

FIGS. 7A and 7B show the positional relationship between the piezo-resistance element 103 and the outline (each side) of the diaphragm 121. FIG. 7A shows the state of no deviation, and the piezo-resistance element is located in such a way as to lie on a central portion of each side of the diaphragm 121. FIG. 7B shows the state of the diaphragm 121 being deviated positionally (in the drawing, the state of being deviated upward and rightward). In the drawing, one side of the diaphragm 121 is specified to be 700 µm, and the dimension of the piezo-resistance element 103 is specified to be 50 µm×40 µm.

FIGS. 8A and 8B are graphs showing the results of simulation of the relationship between the pressure change (from 50 kPa to 100 kPa) and the midpoint potential in the cases where the diaphragm 121 is not deviated positionally and is deviated positionally. In FIG. 8A, the vertical axis indicates the midpoint potential (mV), the horizontal axis indicates the pressure (kPa), and the relationship between the pressure and the midpoint potential is shown where a rhombus indicates a design value, and a quadrangle, a triangle, and X indicate the relationship between the pressure and the midpoint potential in the case where the diaphragm is deviated vertically and horizontally by the amount of deviation of 5 µm, 10 µm, and 15 µm, respectively. FIG. 8B is a graph showing the result of simulation of the rate of change in full scale where the above-described diaphragm is deviated positionally. Regarding the rate of change in full scale, the ratio of the value of full scale of midpoint potential at each amount of deviation is calculated with reference to the value of full scale where the diaphragm is not deviated vertically and horizontally.

As is clear from the results of the simulation, the semiconductor pressure sensor in the related art exhibits deviation of the positional relationship between the diaphragm 121 and the piezo-resistance elements 103, and there is a problem in that the interrelation between the change in pressure and the midpoint potential of the piezo-resistance elements 103 is deviated from the design value so as to cause an error. In this regard, deviation of the size of the diaphragm 121 from the design value causes an error likewise.

SUMMARY OF INVENTION

The present invention provides a semiconductor pressure sensor exhibiting a small relative positional deviation between a diaphragm and piezo-resistance elements or a small error in shape of a diaphragm so as to reduce occurrences of measurement error.

A semiconductor pressure sensor according to an aspect of the present invention includes a cavity disposed in one silicon substrate of a SOI substrate having two silicon substrates bonded to each other with an oxide film therebetween and a diaphragm formed from the other silicon substrate and the oxide film, wherein the oxide film, bordering the above-described cavity, of the diaphragm includes an arc-shaped section at the boundary portion to the above-described one silicon substrate defining the inner wall side surface of the cavity, the arc-shaped section having the same width as the width of the cavity at a desired section in the one silicon substrate and reducing the width of the cavity from the boundary portion toward the diaphragm center.

Preferably, the oxide film, bordering the above-described cavity, of the diaphragm is disposed in such a way as to have a thickness reducing from the above-described boundary portion toward the central portion of the diaphragm and have a region with a small thickness. According to this configuration, the sensitivity error of the diaphragm can be reduced.

Preferably, the above-described cavity is rectangular in the plan view, and more preferably square.

In the semiconductor pressure sensor according to an aspect of the present invention, preferably, the above-described arc-shaped section is disposed along the boundary portion to the above-described one silicon substrate in such a way as to go around the above-described cavity.

It is practical that sensitive resistance elements are disposed along the outline of the above-described diaphragm in such a way as to constitute a bridge circuit on the surface in the circuit side of the diaphragm portion of the above-described SOT substrate.

Preferably, the inner wall side surface of the above-described cavity is disposed almost perpendicularly to the diaphragm. The above-described sensitive resistance element may be a piezo-resistance element having a resistance value changing in accordance with the distortion of the above-described diaphragm.

According to the aspects of the present invention having the above-described configurations, the oxide film constituting the diaphragm has the arc-shaped section at the boundary portion to the silicon substrate defining the inner wall side surface of the cavity. Consequently, the accuracy in relative positions of the outline of the diaphragm and the sensitive resistance elements is high, and an error does not occur easily.

DESCRIPTION OF THE PREFERRED EMBODIMENTS

Figure 1:
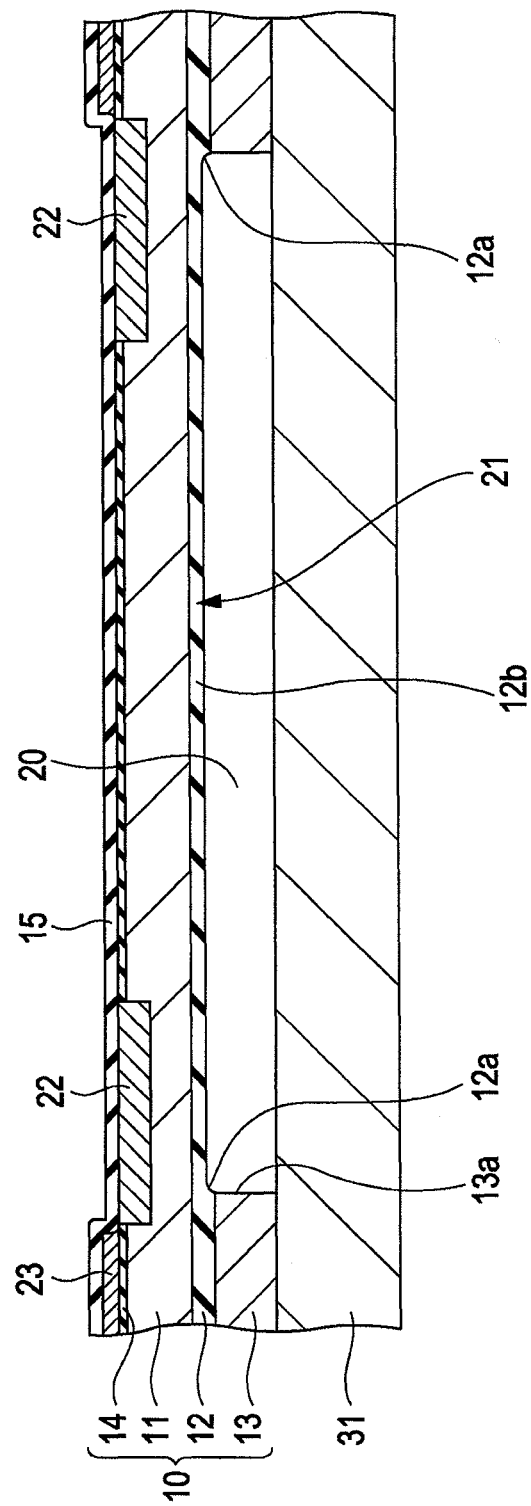
FIG. 1 is a sectional view showing the section of a key portion of a semiconductor pressure sensor according to an embodiment of the present invention, taken along a line I-I shown in FIG. 3.
Figure 2:
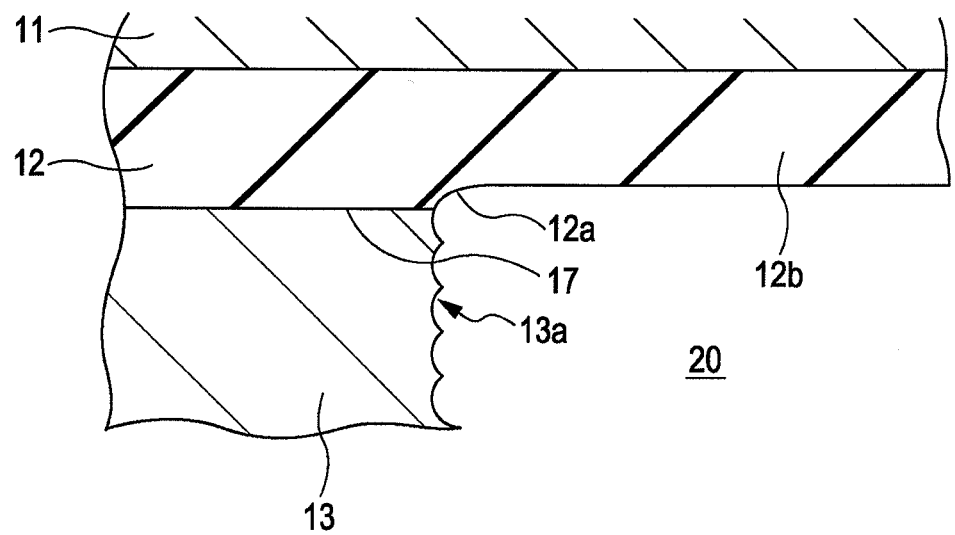
FIG. 2 is a magnified sectional view of a boundary portion between one silicon substrate defining the inner wall of a cavity and a diaphragm oxide film bordering the cavity shown in FIG. 1.
Figure 3:
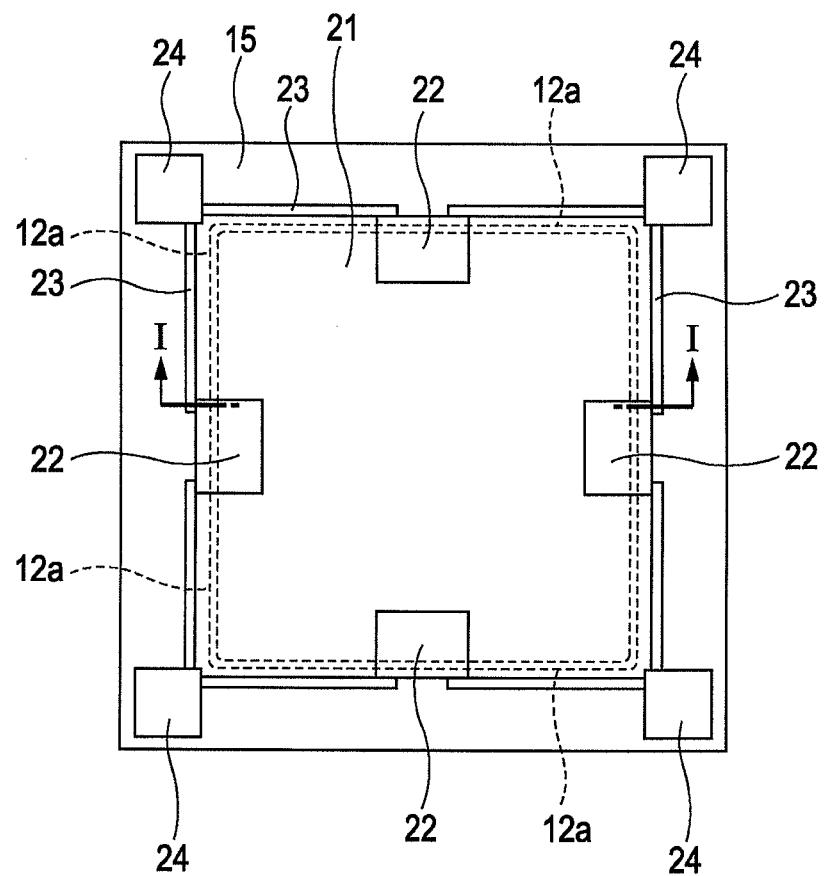
FIG. 3 is a plan view showing a key portion of the semiconductor pressure sensor.

The preferred embodiments according to the present invention will be described with reference to the drawings. FIG. 1 is a sectional view showing the section of a key portion of a diaphragm type semiconductor pressure sensor according to an embodiment of the present invention, taken along a line I-I shown in FIG. 3. FIG. 2 is a magnified sectional view of a boundary portion between a silicon substrate defining the inner wall side surface of a cavity and a diaphragm oxide film bordering the cavity shown in FIG. 1. FIG. 3 is a plan view showing a key portion of the semiconductor pressure sensor.

Initially, a silicon on insulator (SOI) substrate 10 provided with piezo-resistance elements 22, wirings 23, and pads 24 is prepared. In this SOI substrate 10, a first silicon substrate 11 and a second silicon substrate 13 are bonded to each other with a silicon oxide ($SiO_2$) film 12 serving as an oxide film therebetween. A silicon oxide film 14 serving as an oxide film is disposed on a circuit surface (upper surface) of the first silicon substrate 11. The piezo-resistance elements 22 serving as sensitive resistance elements, the wirings 23 electrically continuous with the piezo-resistance elements 22, and the pads 24 are disposed under the silicon oxide film 14 in such a way as to constitute a bridge circuit. Furthermore, a passivation film 15 formed from silicon nitride $Si_3N_4$ or the like is disposed so as to insulate and protect the surface of the piezo-resistance elements 22, the wirings 23, and the first silicon substrate 11. In this regard, the individual pads 24 are exposed at the passivation film 15.

Figure 7A:
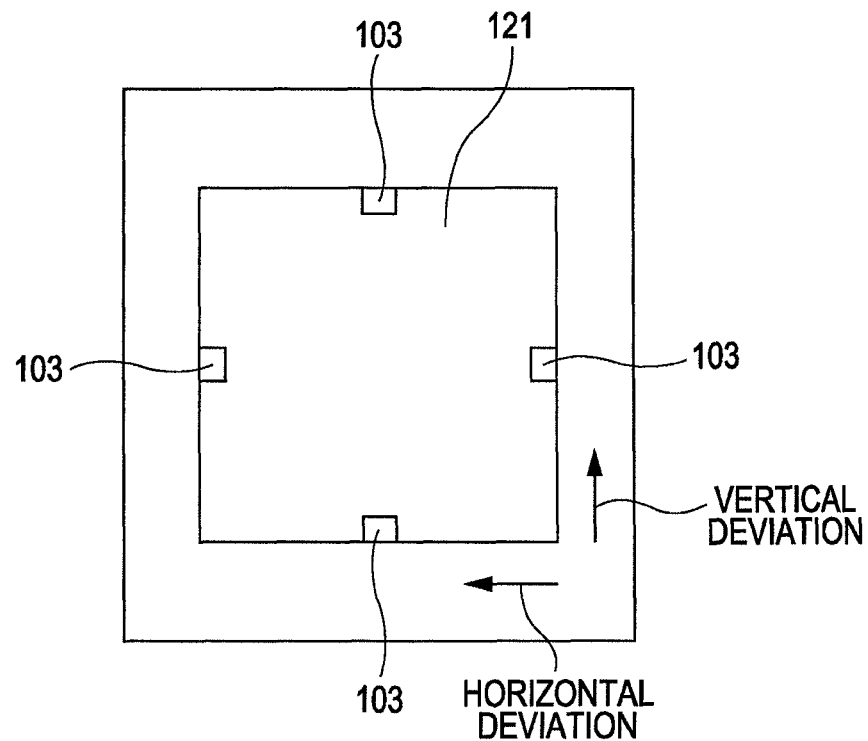
FIGS. 7A and 7B are diagrams explaining the positional relationship between the sensitive resistance elements and the outline of a diaphragm.
Figure 7B:
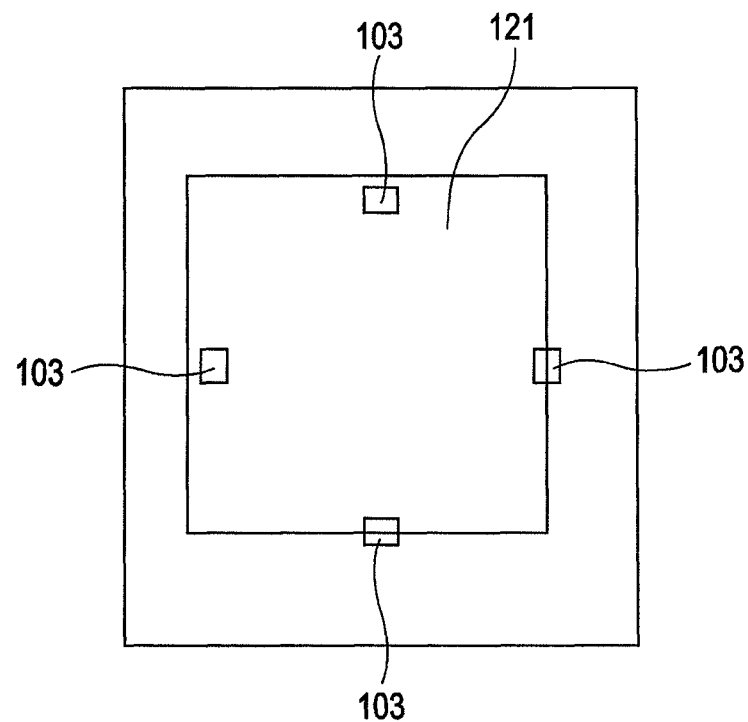
Figure 8A:
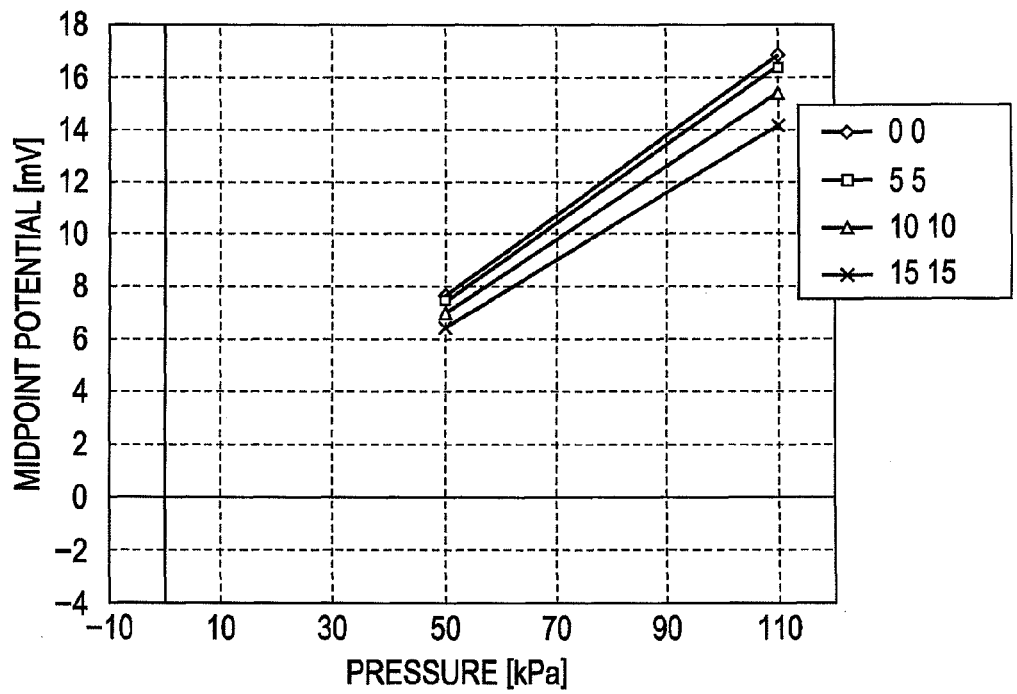
FIGS. 8A and 8B are graphs showing the results of simulation of influences exerted by an error due to positional deviation between sensitive resistance elements and a diaphragm.
Figure 8B:
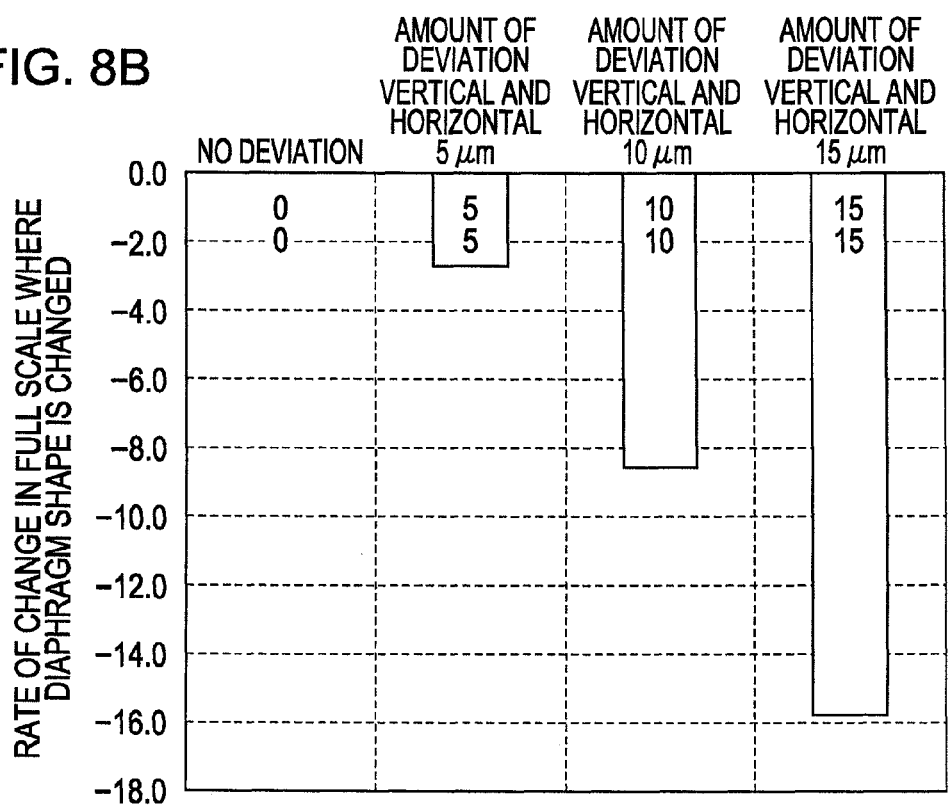

In the SOI substrate 10, a cavity (concave portion) 20 is formed in the second silicon substrate 13 from the surface side of the SOI substrate 10, and a diaphragm 21 is formed from the silicon oxide film 12 constituting the upper surface of this cavity 20, the first silicon substrate 11, the silicon oxide film 14, and the passivation film 15. This diaphragm 21 is rectangular (square) in the plan view (FIG. 3) similarly to the diaphragm shown in FIGS. 7A and 7B. The piezo-resistance elements 22 are disposed at positions lying on the individual sides of the rectangular outline of the diaphragm 21. Put another way, most of the piezo-resistance element 22 is present above the cavity 20 and a part thereof is disposed at a position on the perimeter of the cavity 20.

The silicon oxide film 12 constituting this diaphragm 21 and bordering the cavity 20 includes an arc-shaped section (roundness) 12a at the boundary portion 17 to the second silicon substrate 13 defining the inner wall side surface 13a of the cavity 20, the arc-shaped section 12a having the same width as the width of the cavity at a desired section in the silicon substrate 13 and reducing the width of the cavity from the boundary portion 17 toward the center of the diaphragm 21. Furthermore, this arc-shaped section 12a is disposed continuously all around the silicon oxide film 12 in such a way as to go around the inside of the cavity 20. Since such an arc-shaped section 12a is present, concentration of warping stress generated because of warp and distortion of the diaphragm 21 can be relaxed.

A base substrate 31 formed from a glass substrate or a Si substrate is bonded to the surface (lower surface) of the second silicon substrate 13 of the SOI substrate 10 having the above-described configuration, so that the cavity 20 between the diaphragm 21 and the base substrate 31 is sealed.

Then, the inside of the cavity 20 is brought into a vacuum state.

In the case where this diaphragm 21 is distorted in accordance with a pressure applied to an external surface, the resistance values of the piezo-resistance elements 22 are changed in accordance with the distortion, and the midpoint potential of the bridge circuit formed from the piezo-resistance elements 22 is changed. In this manner, the midpoint potential being changed depending on a change in resistance value of the piezo-resistance elements 22 is output as a sensor output to a publicly known measuring apparatus. In this regard, at least a part of the circuit of this measuring apparatus may be disposed on the circuit surface of the SOI substrate 10.

Figure 4A:
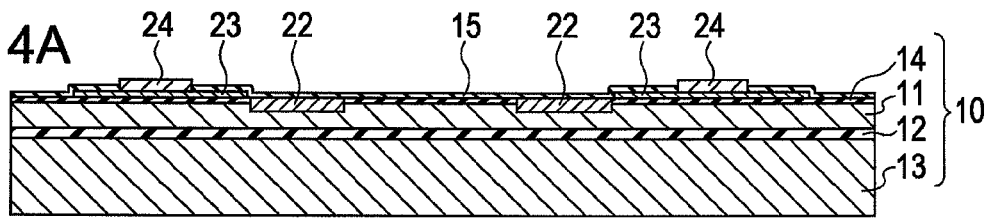
FIGS. 4A to 4G are step diagrams for explaining a production process of the semiconductor pressure sensor.

Next, a method for manufacturing this semiconductor pressure sensor will be described with reference to step diagrams showing the production process, as shown in FIGS. 4A to 4G. FIG. 4A shows the SOI substrate 10 provided with the piezo-resistance elements 22, the wirings 23, the silicon oxide film 14, and the passivation film 15. The SOI substrate 10 at this stage is usually supplied in the state of a silicon wafer.

Figure 4B:
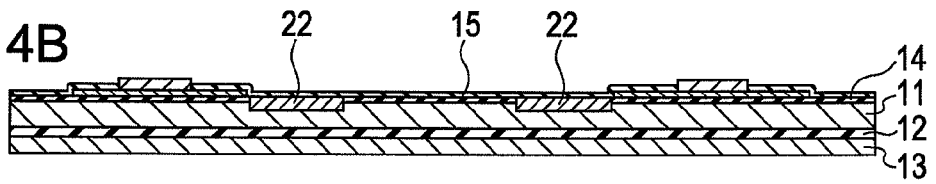

Regarding this SOI substrate 10, initially, the surface of the second silicon substrate 13 serving as a bonding surface to the base substrate 31 is mirror-finished, so that the second silicon substrate 13 having a predetermined thickness is formed (FIG. 4B). This grinding step may be conducted at the stage of producing the silicon wafer.

Figure 4C:
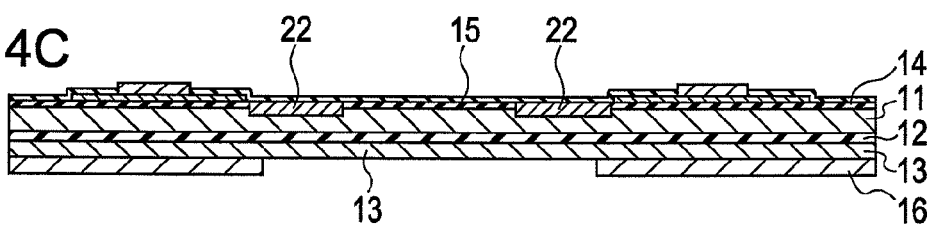

Subsequently, a film of a resist or the like serving as a mask for etching in formation of the diaphragm 21 is formed on the surface (lower surface) of the second silicon substrate 13 from below. This resist film 16 may be formed by a common step through the use of a coater or the like. Thereafter, regarding the resist film 16 formed on the lower surface of the second silicon substrate 13, the resist film 16 corresponding to the region to be provided with the diaphragm 21 is exposed, so as to form a mask with a desired pattern (FIG. 4C). In the present embodiment, a pattern to form the diaphragm 21 having the shape of a rectangle in a plan view is formed.

Figure 4D:
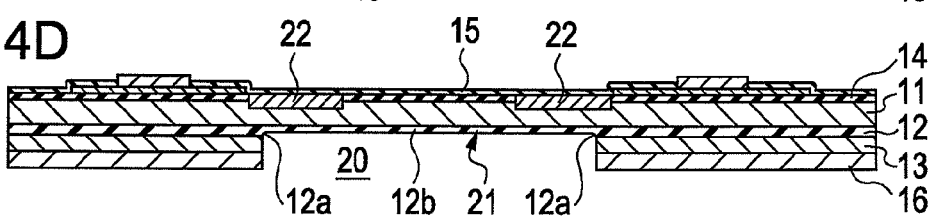

Then, the cavity 20 is dug by dry-etching the second silicon substrate 13 through the use of the resist film 16 as a mask, so as to form the diaphragm 21 (FIG. 4D). Here, the second silicon substrate 13 is dug by repeating the steps of isotropic etching, formation of a protective film, and anisotropic etching from the surface (lower surface in the drawing) of the second silicon substrate 13 side with a publicly known Si-Deep Etcher used in a micro electro mechanical systems (MEMS) process, so as to form the cavity 20. In the Si-Deep Etcher, for example, two types of gases, $C_4F_8$ and $SF_6$, are used.

Regarding the inner wall side surface 13a, a periodic unevenness is formed in a dipping direction through dry etching by repetition of the steps of isotropic etching, formation of a protective film, and anisotropic etching (refer to FIG. 2).

When etching of the second silicon substrate 13 proceeds and the silicon oxide film 12 is reached, the silicon oxide film 12 serves as an etching stopper, and the cavity 20 having the shape of a rectangle in the plan view is formed in the second silicon substrate 13 (refer to FIG. 3). The silicon oxide film 12 is further etched and a silicon oxide film 12b having a predetermined thickness is formed. At that time, the boundary portion 17 between the silicon oxide film 12b and the second silicon substrate 13 in the cavity 20 is etched in such a way as to form the arc-shaped section 12a having the same width as the width of the cavity defined by the second silicon substrate 13 and reducing the width of the cavity from the boundary portion 17 toward the center of the diaphragm 21. This arc-shaped section 12a is formed continuously from the uneven section of the inner wall side surface 13a of the second silicon substrate 13 and is formed all around the boundary portion 17 in such a way as to surround the cavity 20. Consequently, the silicon oxide film 12b is not over etched. In this regard, the silicon oxide film 12b in the cavity 20 is formed in such a way that the thickness is reduced gradually from the arc-shaped section 12a toward the center of the cavity 20 and the thickness of the central portion becomes minimum.

Furthermore, in the present embodiment, the inner wall side surface 13a (inside surface) of the cavity 20 is formed in a direction almost perpendicular to the diaphragm 21. Therefore, regardless of the depth of the cavity 20, the two-dimensional shape and the position relative to the piezo-resistance elements 22 of the cavity 20 are maintained constantly.

The diaphragm 21 is formed from the silicon oxide film 12b serving as the upper surface of the cavity 20, the first silicon substrate 11, and the passivation film 15 through this dry etching step.

Figure 4E:
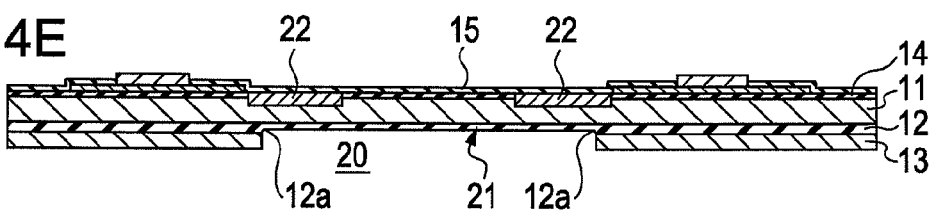

After the diaphragm 21 is formed, the resist film 16 serving as the mask is substantially entirely removed through, for example, publicly known resist peeling (FIG. 4E). In this regard, even when this resist peeing step is conducted, the arc-shaped section 12a of the silicon oxide film 12 is maintained.

Figure 4F:
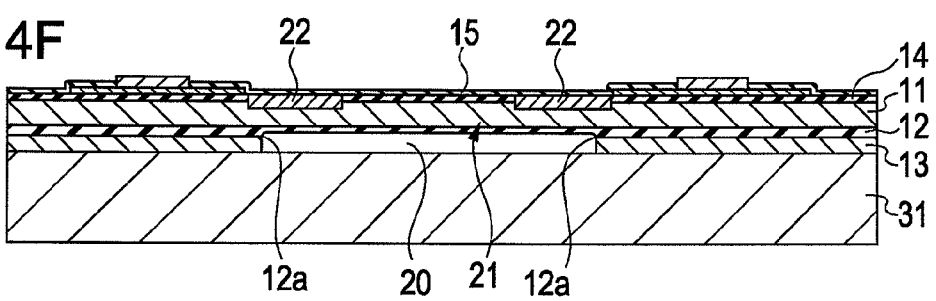

After the resist film 16 is substantially entirely removed, the base substrate 31 is bonded to the surface (lower surface) of the second silicon substrate 13 in a vacuum state (FIG. 4F).

In this manner, the cavity 20 between the diaphragm 21 and the base substrate 31 becomes a vacuum chamber and, thereby, an absolute pressure sensor structure is obtained.

Figure 4G:
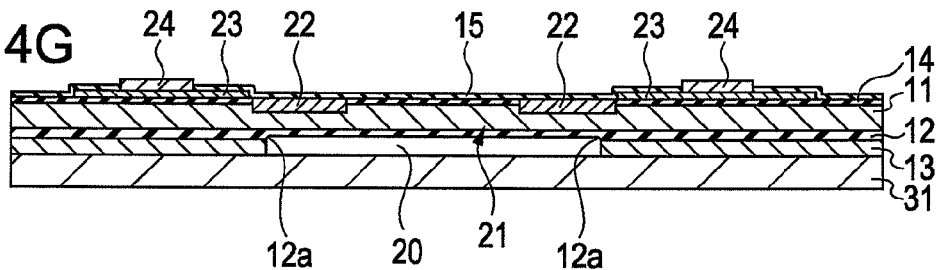

Moreover, as necessary, the surface (lower surface) of the base substrate 31 is ground and, thereby, the thickness thereof is adjusted (FIG. 4G). Then, finally, the wafer produced by bonding the SOI substrate 10 and the base substrate 31 is cut through dicing, so as to be divided on a chip basis. Each of the resulting chip serves as a semiconductor pressure sensor.

from the surface side of the first silicon substrate 11, the diaphragm 21 is distorted, the resistance values of the piezo-resistance elements 22 are changed in accordance with the distortion of the diaphragm 21, and the midpoint potential of the bridge circuit is changed. The resulting midpoint potential is measured with a publicly known measuring apparatus, conversion is conducted by using a predetermined conversion factor and, thereby, the pressure is measured.

As described above, according to the present embodiment, since the arc-shaped section 12a is disposed on the silicon oxide film 12, positional deviation and shape deviation of the diaphragm 21 do not occur easily, errors of position and shape become very small. That is, regarding the pressure and the midpoint potential, a semiconductor pressure sensor provided with design characteristics is obtained easily.

Next, dynamic characteristics of the above-described semiconductor pressure sensor will be described. Here, regarding the embodiments according to the present invention, the results obtained from simulation of the relationship between the size of the cavity 20, the thickness of the diaphragm 21, the radius of the arc-shaped section 12a, and the material for the diaphragm 21 and the tensile pressure applied to the diaphragm 21 and the maximum value of the maximum principal stress will be described.

Table 1 shows the cavity size, the thickness of the diaphragm, the radius of the arc-shaped section, and the material for the diaphragm.

TABLE 1

| Condition No. | Cavity size (μm) | Thickness of diaphragm (μm) | Radius of arc-shaped section (μm) | Material for diaphragm |
|---|---|---|---|---|
| No. 1 | 700 | 10 | 2 | Si |
| No. 2 | | | | $SiO_2$ |
| No. 3 | | | 5 | Si |
| No. 4 | | | | $SiO_2$ |
| No. 5 | | | 10 | Si |
| No. 6 | | | | $SiO_2$ |

The properties of Si and $SiO_2$ used in this simulation were as shown in Table 2.

TABLE 2

| | Young's modulus (GPa) | Poisson's ratio | Breaking stress (MPa) | Remarks |
|---|---|---|---|---|
| Si | 150 | 0.17 | 3400 | Crystal anisotropy is not considered |
| $SiO_2$ | 67 | 0.25 | 1900 | |

Figure 5:
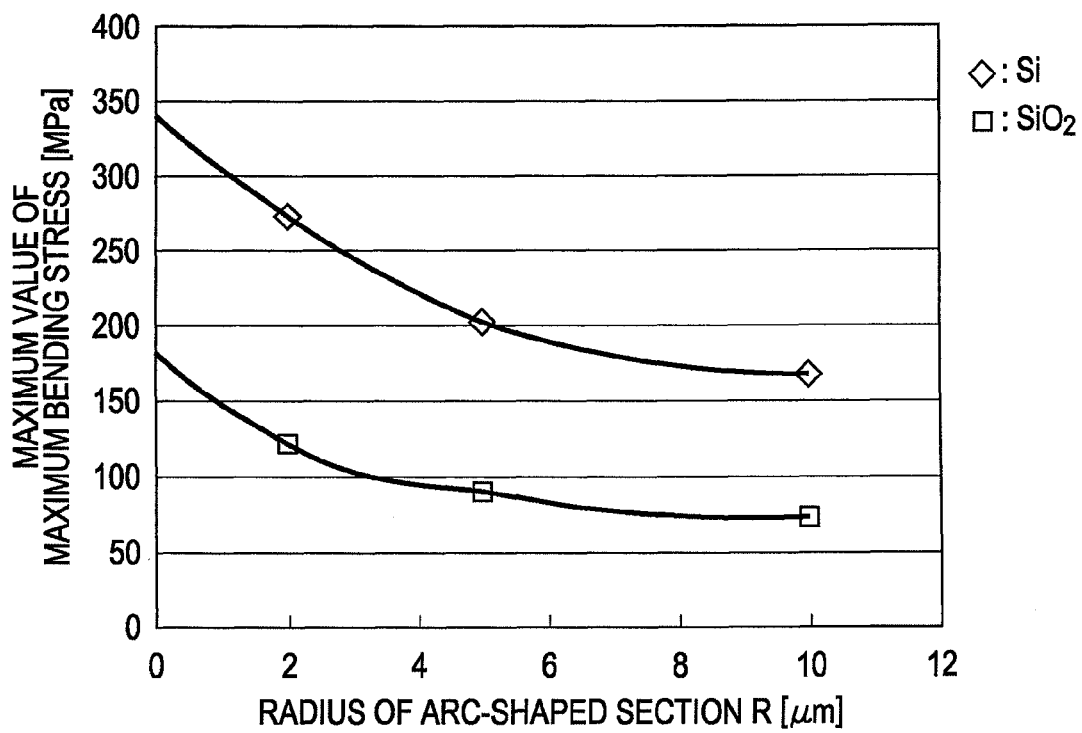
FIG. 5 is a graph showing the results of pressure resistance simulation of the semiconductor pressure sensor where the radius of an arc-shaped section is changed.
Figure 6:
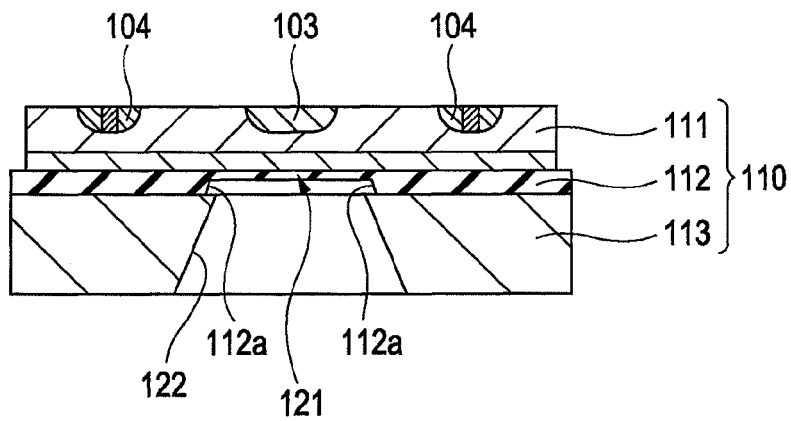
FIG. 6 is a sectional view showing a longitudinal section of a key portion of a semiconductor pressure sensor in a related art.

The results of the simulation conducted under the above-described conditions are as shown in Table 3 described below and indicated by a graph shown in FIG. 5. In this regard, the maximum bending stress is the maximum value of stress generated in the arc-shaped portion (arc-shaped section 12a in FIG. 1) assuming that distortion corresponding to 1 atmosphere is applied to the diaphragm.

TABLE 3

| Condition No. | Cavity size (μm) | Thickness of diaphragm (μm) | Radius of arc-shaped section (μm) | Material for diaphragm | Maximum value of maximum principal stress (MPa) |
| --- | --- | --- | --- | --- | --- |
| No. 1 | 700 | 10 | 2 | Si | 273.90 |
| No. 2 | 700 | 10 | 2 | $SiO_2$ | 123.10 |
| No. 3 | 700 | 10 | 5 | Si | 203.30 |
| No. 4 | 700 | 10 | 5 | $SiO_2$ | 91.30 |
| No. 5 | 700 | 10 | 10 | Si | 168.10 |
| No. 6 | 700 | 10 | 10 | $SiO_2$ | 75.38 |

As is clear from the results of the simulation, regarding the semiconductor pressure sensor according to the present embodiment, the maximum values of the maximum bending stress applied to the arc-shaped section 12a were reduced in the order of the radius of the arc-shaped section 12a of 2 μm, 5 μm, and 10 μm. Consequently, regarding the semiconductor pressure sensor according to the present invention, the maximum value of the maximum principal stress was small and the stress was dispersed because of being provided with the arc-shaped section 12a, so that breakage due to stress concentration was avoided and the pressure resistance increased. In the present embodiment, it was preferable that the radius of the arc-shaped section 12a was about 10 μm. In addition, it was preferable that the arc-shaped section 12a was disposed on the silicon oxide film 12 rather than the second silicon substrate 13.

The above-described embodiment is the absolute pressure sensor with the cavity 20 being in a vacuum state. However, the present invention may be applied to a differential pressure sensor or a gage pressure sensor provided with a pressure introduction hole in the base substrate 31 in such a way that a cavity 20 communicates with the outside.

Furthermore, the piezo-resistance elements are used as the sensitive resistance elements. However, other elements may be used insofar as the elements can detect distortion of the diaphragm 21. Moreover, the shape of the diaphragm 21 may be other shapes insofar as the shapes are distorted because of application of a pressure. In addition, the number and the position of disposition of the sensitive resistance elements are not limited.

Since accuracy variation is small, and miniaturization and a reduction in thickness are facilitated, it is possible to apply to air pressure and atmospheric pressure measurement uses, e.g., a cellular phone, a portable navigation device (PND), a wristwatch, and a pedometer, where small thickness, small size, and high accuracy are required.

What is claimed is:

1. A semiconductor pressure sensor comprising:
   a cavity disposed through digging in a one silicon substrate of a SOI (Silicon-On-Insulator) substrate having two silicon substrates bonded to each other with an oxide film therebetween; and
   a diaphragm formed from the other silicon substrate and the oxide film,
   wherein a periodic uneven section is disposed, in the digging direction, on an inner wall surface of the cavity in the one silicon substrate,
   the oxide film, bordering the cavity, of the diaphragm includes an arc-shaped section at a boundary portion to the one silicon substrate defining the inner wall side surface of the cavity, the arc-shaped section having the same width as the width of the cavity at a desired section of the cavity in the one silicon substrate and reducing the width of the cavity from the boundary portion toward the diaphragm center, and
   the arc-shaped section is disposed continuously from the periodic uneven section of the one silicon substrate.

2. The semiconductor pressure sensor according to claim 1, wherein the oxide film, bordering the cavity, of the diaphragm has a thickness reducing from the boundary portion toward the central portion of the diaphragm and has a region with a small thickness.

3. The semiconductor pressure sensor according to claim 1, wherein the cavity is rectangular in a plan view.

4. The semiconductor pressure sensor according to claim 1, wherein the arc-shaped section is disposed all around the boundary portion of the cavity.

5. The semiconductor pressure sensor according to claim 1, wherein on the diaphragm portion of the SOI substrate, sensitive resistance elements are disposed along the outline of the diaphragm in such a way as to constitute a bridge circuit.

6. The semiconductor pressure sensor according to claim 1, wherein the inner wall side surface of the cavity is disposed almost perpendicularly to the diaphragm.

7. The semiconductor pressure sensor according to claim 1, wherein the sensitive resistance element is a piezo-resistance element having a resistance value changing in accordance with distortion of the diaphragm.

* * * * *